United States Patent
Wyant et al.

(10) Patent No.: US 6,472,728 B2
(45) Date of Patent: Oct. 29, 2002

(54) CONDITION SENSITIVE ADHESIVE TAPE FOR SINGULATED DIE TRANSPORT DEVICES

(75) Inventors: M. Todd Wyant, Kokomo, IN (US); Michael R. Greeson, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/798,848

(22) Filed: Mar. 5, 2001

(65) Prior Publication Data

US 2002/0121681 A1 Sep. 5, 2002

(51) Int. Cl.⁷ .......................................... H01L 23/495
(52) U.S. Cl. ...................................... 257/668; 257/783
(58) Field of Search ................................ 438/122, 118, 438/56, 464, 106, 113, 123; 257/9, 680, 783, 686, 685, 668, 704, 749, 724, 29, 35

(56) References Cited

U.S. PATENT DOCUMENTS

| | | | | |
|---|---|---|---|---|
| 4,921,564 A | * | 5/1990 | Moore | 156/344 |
| 4,941,255 A | * | 7/1990 | Bull | 29/833 |
| 5,524,765 A | * | 6/1996 | Gutentag | 206/713 |
| 5,976,955 A | * | 11/1999 | Hodges | 156/247 |
| 6,107,680 A | * | 8/2000 | Hodges | 206/724 |

* cited by examiner

*Primary Examiner*—David Nelms
*Assistant Examiner*—Long K. Tran
(74) *Attorney, Agent, or Firm*—Jimmy L. Funke

(57) ABSTRACT

The transport of singulated die devices (110) is improved by utilizing condition sensitive adhesive tape (102) in a die transport system (100). Condition sensitive adhesive tape (102) is adhered to the bottom surface of a carrier plate (104) so as to cover a series of holes (106) formed in the carrier plate (104). The tape (102) is preferably heat sensitive adhesive tape (102) and may alternatively be ultraviolet light sensitive adhesive tape (102). The die transport system (100) contains die devices (110) in the carrier plate (104) by adhering the condition sensitive adhesive tape (102) to the bottom surface of the die devices (110). To release the die devices (110), the tape (102) is exposed to a certain condition in order to diminish its adhesiveness. Then, a vacuum suction force is used to pick up the die device (110) and remove it from the transport system (100).

12 Claims, 1 Drawing Sheet

CONDITION SENSITIVE ADHESIVE TAPE FOR SINGULATED DIE TRANSPORT DEVICES

FIELD OF THE INVENTION

The present invention relates generally to singulated die transport devices, and more particularly concerns die transport devices employing condition sensitive adhesive tape to receive, retain, and release the components in automated assembly processing.

BACKGROUND OF THE INVENTION

Die transport devices are presently a staple item in today's industry for manufacturing electrical devices. These transport devices are used to receive, retain and release small electrical components, also known as "die devices." These include, for example, single integrated circuits, chip transistors, chip capacitors, mechanical bonding pads, and outline transistors. Die devices typically are square or rectangular and about 0.024 inches in height or thickness. Pressure sensitive adhesive (PSA) tape is currently employed to secure the die devices to the carrier devices during transportation until installation of the components. Removal of a die device from a typical transport device using PSA tape requires a needle or some other device to pierce the tape affixed to the die device and displace the die device away from the tape. This removal process makes small integrated circuits susceptible to mechanical and electrical damage. At the minimum, a small divot is formed no matter how light the contact is between the needle and the die device. Further, the components are not consistently removed from the transport device depending on the size of the die device and the adhesive levels of the PSA tape. Since die devices are fragile and proper installation of these components is crucial, enhancing the handling of die devices associated with the transport device is extremely important.

There are many proposed solutions for improving the handling of die devices associated with a transport device. Three proposed solutions seek to eliminate improper retrieval of the die devices. One solution involves a system requiring the use of a tape known as "embossed with cover" tape. This system includes a carrier having a pocket formed therein for receiving the die device. Cover tape is affixed to the top surface of the carrier so as to secure the die device in place. A hole is formed in the bottom of the pocket to permit a needle or some other device to enter and displace the die device out of the pocket after the cover tape has been removed. Unfortunately, this technique does not eliminate the risk of mechanical and electrical damage associated with contact between the needle and the die device. Further, other problems arise in substituting cover tape for PSA tape. First, vibration forces resulting from the removal of the cover tape can cause the die device to come out of the pocket before being extracted from the pocket. Second, the cover tape, although transparent, prevents inspection of the die device at high magnification. Third, the cover tape must be sized according to the dimensions of the pocket proportioned for its respective die device. Finally, it is difficult to uniformly seal cover tape to the carrier.

Another solution involves a system that utilizes a tape known as "punched with cover" tape. This system requires a carrier with a plurality of holes formed therein. Cover tape is placed on the bottom side of the carrier so as to completely cover the holes and provide a support for receiving the die device. Cover tape is also placed on the top of the carrier to secure the die device in position. To remove the die device, the cover tape on the top side of the carrier is removed and subsequently a needle pierces the bottom cover tape to displace the die device out of the pocket. This system also fails to resolve the risk of mechanical and electrical damage resulting from the contact between the needle and the die device. Further, the use of cover tape results in the same adverse effects experienced in using the first solution.

A third solution requires a system to employ strips of PSA tape. This system involves a carrier with a plurality of holes or openings. Strips of PSA tape are affixed to the bottom surface of the carrier so as to partially cover each hole and provide a support for receiving the die device. To remove the die device a needle passes through the gap between the strips of PSA tape, contacts the die device, and displaces it away from the tape and out of the carrier. Unfortunately, this system also fails to eliminate the risk of mechanical and electrical damage associated with the contact between the needle and the die device. Further, small pieces of adhesive material can remain on the bottom surface of the die device after removal and cause problems when the die device are soldered in the component placement process.

Therefore, a need exists for a singulated die transport with enhanced die device release to allow for proper inspection and extraction without undue risk of damage to the die device.

SUMMARY OF THE INVENTION

In accordance with the present invention, a die transport device includes condition sensitive adhesive tape. The condition sensitive adhesive tape is adhered to a bottom surface of a carrier plate within the transport device so as to cover a series of holes or openings formed in the carrier plate. The holes are subject to receive small electrical components, known as "die devices," such as single integrated circuits, wherein the bottom surfaces of the die devices adhere to the condition sensitive adhesive tape. In this regard, the carrier plate can have one or more holes or openings, depending on the size of the die device and/or the number of die devices needed. The size of the holes varies depending on factors such as the size of the die devices and width of the tape. A typical diameter of the hole is 1.5 mm.

In a preferred arrangement, heat sensitive adhesive tape is adhered to the bottom surface of the carrier plate within the transport device so as to cover the holes formed in the carrier plate. To secure the die devices in the transport device, the heat sensitive adhesive tape adheres to the bottom surfaces of the die devices contained within the holes. To release the die device from the transport device, the heat sensitive adhesive tape is heated to a point where the adhesive capacity of the tape has diminished. A suction force is then applied to remove the die devices from the transport device. The die devices can be deposited on a work surface, placed directly onto a circuit board, or the like, depending on the user's needs.

In an alternate arrangement, ultraviolet light sensitive adhesive tape is adhered to the bottom surface of the carrier plate within the transport device so as to cover the holes or openings formed in the carrier plate. Using the ultraviolet light sensitive adhesive tape, the die devices are secured in the transport device on the tape in the same manner as described above. One side of the tape is adhesive and securely holds and retains the die devices in position in the carrier during transport. In order to remove the dies from the transport device, the tape is exposed to ultraviolet light so as to release the adhesive.

DETAILED DESCRIPTION OF THE PREFERRED EMBODIMENTS

Figure 1:
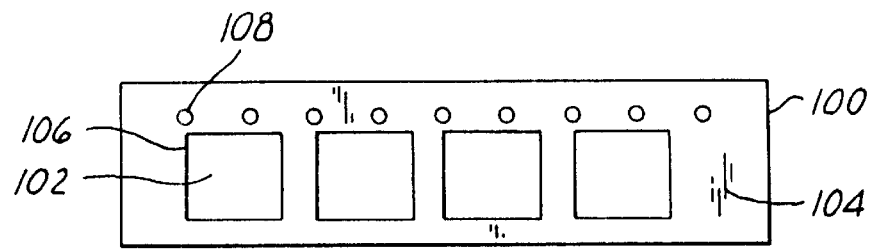
FIG. 1 is a schematic diagram showing a top view of a preferred arrangement of a die transport device employing heat sensitive adhesive tape in accordance with the present invention.

FIG. 1 is a schematic diagram showing a top view of a die transport system 100 with condition sensitive adhesive tape 102 in accordance with the present invention. The condition sensitive adhesive tape is preferably a heat sensitive adhesive tape and alternatively an ultraviolet light sensitive adhesive tape. The condition sensitive adhesive tape 102 adheres to the bottom surface of the bottom surface of the carrier plate 104 within the transport system 100 so as to cover the holes 106 formed in the carrier plate 104. Within these holes 106, the carrier plate 104 receives, retains, and releases die devices. The holes 106 are sized larger than the die devices to be secured within the holes 106. Since the typical die device is square or rectangular in shape, the holes 106 are typically formed in the same manner. The carrier plate 104 also has drive holes 108 to allow for automated handling of the die transport system 100 with automatic processing equipment and typically has a thickness of about 0.024 inches. Preferably, the carrier plate 104 is made of a polyvinylchloride (PVC) material.

Figure 2:
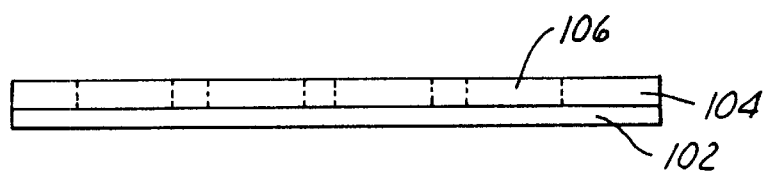
FIG. 2 is a schematic diagram showing a side view of a preferred arrangement of a die transport device employing heat sensitive adhesive tape in accordance with the present invention.

FIG. 2 is a schematic diagram showing a side view of the die transport system 100 as shown in FIG. 1. The condition sensitive adhesive tape 102 is adhered to the bottom surface of the carrier plate 104 so as to cover the holes 106. To secure the die devices in the carrier, the condition sensitive adhesive tape 102 adheres to the bottom surface of the die devices and holds them in place.

Figure 3:
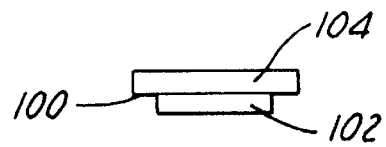
FIG. 3 is a schematic diagram showing a front view of an alternate arrangement of a die transport device employing heat sensitive adhesive tape in accordance with the present invention.

FIG. 3 is a schematic diagram showing a front view of a die transport system 100 with condition sensitive adhesive tape 102 as shown in FIGS. 1 and 2.

Figure 4:
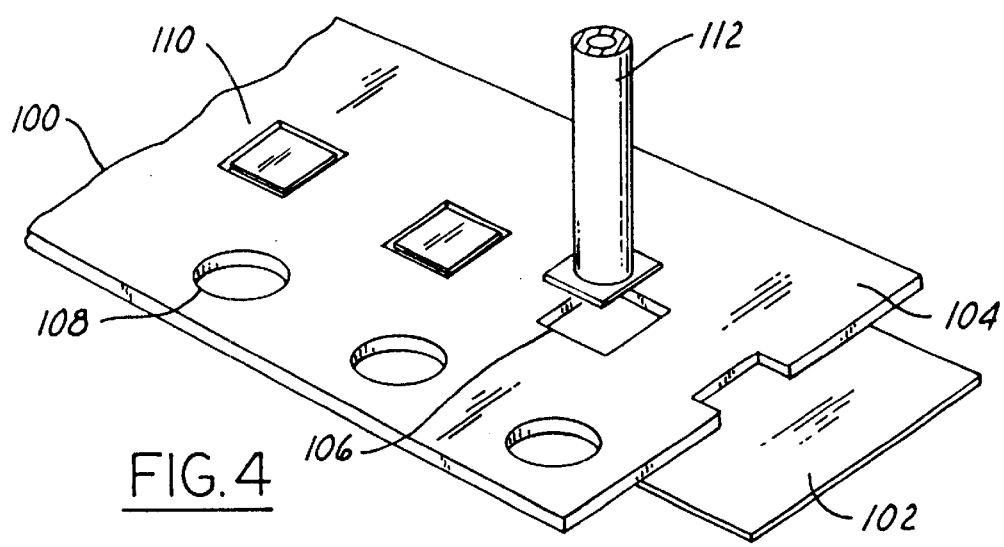
FIG. 4 is a schematic perspective view of a method of removing die devices from the preferred arrangement of a die transport device employing heat sensitive adhesive tape in accordance with the present invention.

FIG. 4 is a perspective view of a method for extracting die devices 110 from the die transport device 100 in accordance with the present invention. Die devices 110 are contained within the die transport device 100. Typically, the die devices 110 are small components, such as single integrated circuits, chip transistors, chip resistors, mechanical bonding pads, and outline transistors. To remove the die devices 110 from a device 100 utilizing heat sensitive adhesive tape 102, first heat is applied to the heat sensitive adhesive tape 102 so as to reduce the adhesive force between the die devices 110 and the heat sensitive adhesive tape 102. The type of heat and method of heat application is dependent on the tape utilized. The temperature of the heat is sufficient to release the adhesive characteristics of the tape, but not be sufficient to affect the die devices 110. Alternatively, to remove the die devices 110 from a device 100 using ultraviolet light sensitive adhesive tape 102, first the ultraviolet light sensitive adhesive tape 102 is exposed to ultraviolet light in order to reduce the adhesion between the tape 102 and the die devices 110. Then, the die devices 110 are removed from the holes 106 or openings by a vacuum suction force applied through a small rubber-tipped vacuum hose 112. The hose 112 picks up the die devices 110 individually. Once the die devices 110 are removed, they are deposited on a work surface or already on the circuit board or the like and secured in place.

While the invention has been described in connection with one or more embodiments, it should be understood that the invention is not limited to those embodiments. On the contrary, the invention covers all alternatives, modifications, and equivalents, as may be included within the spirit and scope of the appended claims.

What is claimed is:

1. A die transport system comprising:

a carrier plate having a top surface, a bottom surface, and at least one hole formed therein extending between said top surface and said bottom surface, said at least one hole being sized to receive a die device therein; and a sheet of adhesive tape adhered to said bottom surface of said carrier plate, said sheet of adhesive tape covering one side of said at least one hole and being positioned to contact said die device when disposed in said at least one hole, said sheet of adhesive tape being comprised of a material having a diminished adhesive capacity at an elevated temperature, and wherein die devices can be removed from said carrier plate solely when said adhesive tape is subjected to an elevated temperature sufficient to reduce its adhesive capacity.

2. The die transport system of claim 1 wherein said carrier plate is made of a plastic material.

3. The die transport system of claim 1 wherein said carrier plate is made of a polyvinylchloride (PVC) material.

4. The die transport system of claim 1 wherein said carrier plate contains at least one drive hole formed therein so as to allow automated handling of the carrier system by automatic processing equipment.

5. The die transport system of claim 1 wherein said die device being from a group consisting essentially of integrated circuits, chip capacitors, mechanical bonding pads, chip resistors, and small outline transistors.

6. A method of receiving, holding, and releasing die devices in a die transport system, said method comprising the steps of:

providing a die transport system having a carrier plate with a top surface and a bottom surface and at least one hole extending between said top surface and said bottom surface, said carrier plate having a sheet of adhesive tape affixed to said bottom surface to cover said at least one hole;

placing a die device in each of said at least one hole, one side of said die device affixing to said sheet of adhesive tape;

subjecting said sheet of adhesive tape to an elevated temperature sufficient to reduce the adhesiveness of said sheet of adhesive tape sufficient to allow removal of said die device from said carrier plate; and removing said die device from said die transport system;

wherein the reduction of the adhesiveness of said sheet of adhesive tape is sufficient by itself to allow removal of said die devices from said carrier plate.

7. The method of claim 6 wherein said carrier plate is made of a plastic material.

8. The method of claim 6 wherein said carrier plate is made of a polyvinylchloride (PVC) material.

9. The method of claim 6 wherein the step of removing said die device from said transport system is accomplished by engaging a suction force to said die device.

10. The method of claim 9 wherein said step of applying a suction force on said die device is achieved by using a rubber-tipped hose and a vacuum.

11. The method of claim 6 wherein said die device is from a group consisting essentially of integrated circuits, chip capacitors, mechanical bonding pads, chip resistors, and small outline transistors.

12. The method of claim 6 further comprising the step of providing at least one drive hole in said carrier plate to facilitate handling of said die transport system.

* * * * *